United States Patent
Engelhardt et al.

(10) Patent No.: US 6,454,956 B1
(45) Date of Patent: Sep. 24, 2002

(54) STRUCTURING METHOD

(75) Inventors: Manfred Engelhardt, Feldkirchen-Westerham; Volker Weinrich, München, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/128,389

(22) Filed: Aug. 3, 1998

(30) Foreign Application Priority Data

Aug. 1, 1997 (DE) .......................................... 197 33 391

(51) Int. Cl.$^7$ ................................................. B08B 1/04
(52) U.S. Cl. ........................... 216/53; 216/57; 134/1.2; 134/33; 510/176; 438/959; 438/963
(58) Field of Search .................... 510/176; 438/959, 438/963; 134/1.2, 33; 216/52, 53, 57

(56) References Cited

U.S. PATENT DOCUMENTS

| | | | |
|---|---|---|---|
| 4,933,318 A | 6/1990 | Heijman ........................ 505/1 |
| 5,244,538 A | 9/1993 | Kumar ........................ 156/643 |
| 5,394,000 A | 2/1995 | Ellul et al. ................... 257/301 |
| 5,545,289 A | * 8/1996 | Chen et al. ................. 156/643.1 |
| 5,585,661 A | 12/1996 | McLachlan et al. ......... 257/506 |
| 5,643,836 A | 7/1997 | Meister et al. ............... 437/228 |
| 5,679,213 A | 10/1997 | Noshiro .................... 156/643.1 |
| 5,736,462 A | * 4/1998 | Takahashi et al. ........... 438/692 |
| 5,976,928 A | * 11/1999 | Kirlin et al. ................. 438/240 |
| 5,981,454 A | * 11/1999 | Small ........................ 510/175 |
| 6,004,839 A | 12/1999 | Hayashi et al. .............. 438/210 |
| 6,037,264 A | * 3/2000 | Hwang ........................ 438/714 |

FOREIGN PATENT DOCUMENTS

| | | |
|---|---|---|
| EP | 0 425 787 A2 | 5/1991 |
| EP | 0 578 507 A2 | 1/1994 |
| EP | 0 865 079 A2 | 9/1998 |
| JP | 56-016 676 | 2/1981 |
| JP | 7-130702 | 5/1995 |
| JP | 9-199679 | 7/1997 |

OTHER PUBLICATIONS

Tabara, W/Si2 Polysilicon Gate Etching Using TiN Hard Mask in Conjunction with Photoresist, Jpn. J. Appl. Phys., vol. 36 pp. 2508–2513, Apr. 1997.*

Peters, Stripping Today's Toughest Resist, Semiconductor International, vol. 15, No. 2 pp. 58–64, Feb. 1992.*

Kazuyasu Nishikawa et al.: "Platinum Etching and Plasma Characteristics in RF Magnetron and Electron Cyclotron Resonance Plasmas", Jpn. J. Appl. Phys. vol. 32 (1993), pp. 6102–6108.

Mamoru Baba: "Fabrication of Au Fine patterns by Ar Sputter Etching Using MoO$_3$ Mask", Jpn. J. Appl. Phys. vol. 31 (1992), pp. 947–948.

* cited by examiner

*Primary Examiner*—Randy Gulakowski
*Assistant Examiner*—Allan Olsen
(74) *Attorney, Agent, or Firm*—Hebbert L. Lerner; Laurence A. Greenberg; Werner H. Stemer

(57) ABSTRACT

A method for structuring at least one layer to be structured. First, a mask is applied to the layer and the layer is structured using the mask. After the structuring step, the mask is then removed, while leaving behind redepositions of the material of the layer. The redepositions of the material of the layer are removed by mechanical polishing or chemical-mechanical polishing.

33 Claims, 2 Drawing Sheets

STRUCTURING METHOD

BACKGROUND OF THE INVENTION

Field of the Invention

The present invention relates to a structuring method, in particular a method for structuring layers. Such layers including layers of noble metals, ferroelectric materials, and dielectric materials with high relative dielectric constants, that can be etched only with difficulty if at all by plasma or by dry chemical etching.

In the development of large scale integrated memory components, such as DRAMs and FRAMS, the cell capacity should be preserved or even further improved while miniaturization increases. To achieve this goal, thinner and thinner dielectric layers and convoluted capacitor electrodes (trench cell, stack cell) are used. Recently, instead of conventional silicon oxide, new materials are being used, especially paraelectrics and ferroelectrics, between the capacitor electrodes of a memory cell. For example, barium strontium titanate (BST, $(Ba,Sr)TiO_3$), lead zirconate titanate (PZT, $Pb(Zr,Ti)O_3$), or lanthanum-doped lead zirconate titanate or strontium bismuth tantalate (SBT, $SrBi_2Ta_2O_9$) have been used in the capacitors of memory cells in DRAMs and FRAMs.

The materials are typically deposited onto already existing electrodes (bottom electrodes). The processing is done at high temperatures, so that the materials that normally form the capacitor electrodes, such as doped polysilicon, easily become oxidized and lose their electrically conductive properties, which would cause the memory cell to fail.

Because of their good oxidation resistance and/or the development of electrically conductive oxides, 4d and 5d transition metals, in particular platinum metals (Ru, Rh, Pd, Os, Ir, Pt) and in particular platinum itself, as well as rhenium are considered promising candidates that might replace doped polysilicon as electrode material in the aforementioned memory cells.

Progressive miniaturization of components also requires the need for substitute materials for aluminum currently used for the conductor tracks. The substitute material should have a lower specific resistance and a lesser electromigration than aluminum. Copper is considered to be the most promising candidate.

The development of magnetic random access memories (MRAMs) also requires the integration of magnetic layers (such as Fe, Co, Ni, or Permalloy) in microelectronic circuits.

If an integrated circuit is to be constructed from the aforementioned materials, which so far are not widely used in semiconductor technology, then thin films of these materials will have to be structured.

Structuring the materials used until now has been done as a rule by the so-called plasma reinforced anisotropic etching methods. Typically physical-chemical processes are employed, in which gas mixtures of one or more reactive gases, such as oxygen, chlorine, bromine, hydrogen chloride, hydrogen bromide or halogenated hydrocarbons, and noble gases (such as Ar, He) are used. The gas mixtures are as a rule excited in an electromagnetic alternating field at low pressures.

The basic operating mode of a plasma etching chamber is known for example from a parallel-plate reactor. A gas mixture, such as Ar and $Cl_2$, is delivered to the reactor chamber via a gas inlet and is pumped out again through a gas outlet. A lower plate of the parallel plate reactor communicates via a capacitor with a high-frequency source and acts as a substrate holder. By applying a high-frequency electrical alternating field to an upper plate and the lower plate of the parallel plate reactor, the gas mixture is converted into a plasma. Since the mobility of the electrons is greater than that of the gas cations, the upper and lower plates become negatively charged capacitively compared with the plasma. The two plates therefore exert a strong attraction force on the positively charged gas cations, so that they are exposed to a permanent bombardment with the ions, such as $Ar^+$. Since the gas pressure is also kept low, typically 0.1 to 10 Pa, only a slight scattering of the ions among one another and with the neutral particles occurs. The ions meet the surface of a substrate, which is held on the lower plate of the parallel plate reactor, virtually at a right angle. This allows good duplication of a mask on the underlying layer, which is to be etched, of the substrate.

Typically, photoresists are used as mask materials, because they are relatively easy to structure by a light exposure step and a development step.

The physical component of the etching is accomplished by impetus and kinematic energy of the arriving ions (such as $Cl_2^+$, $Ar^+$). In addition, chemical reactions between the substrate and the reactive gas particles (ions, molecules, atoms, radicals) are initiated or reinforced thereby (the chemical component of the etching), forming volatile reaction products. The chemical reactions between the substrate particles and the gas particles are responsible for high etching selectivities of the etching process.

Unfortunately, it has been found that the aforementioned materials newly used in integrated circuits are among those materials that can be etched chemically only with difficulty if at all. The amount of removal by etching, even if "reactive" gases are used, is predominantly or virtually exclusively due to the physical component of the etching. Because the chemical component of the etching is only slight or is absent, the amount of removal by etching from the layer to be structured is on the same order of magnitude as the amount of removal by etching of the mask or the underlay (etch stop layer). In other words the etching selectivity with respect to the etching mask or underlay is generally low (between about 0.3 and 3.0). Consequently, because of the erosion of masks with sloping flanks and because of the unavoidable faceting (beveling, tapering) on the masks, only slight dimensional stability of the structuring can be assured. The faceting thus limits both the smallest feature sizes that can be attained in the structuring and the attainable steepness of the profile edges in the layers to be structured.

The faceting on the masks, and thus the faceting of the layers to be structured, is greater, the greater the proportion of reactive gases (in particular chlorine) in the gas mixture that is used during the plasma-chemical etching process. Correspondingly, with gas mixtures that have no reactive gas component, examples being pure argon plasmas, the steepest profile edges of the layers to be structured can be created.

In addition to the aforementioned faceting of the layers to be structured, undesired redepositions of the material of layer to be structured can also occur in the structuring process. The redepositions occur for instance on the side walls of the resist mask, and often they can be removed in ensuing process steps only at major effort and expense. Unfortunately, the redepositions occur all the more frequently, the lower the proportion of reactive gases in the gas mixture used during the plasma-chemical etching process. Hence until now, process control was usually limited to assuring low proportions of argon, for instance in a chlorine-argon plasma. Yet increasing the proportion of chlorine in the etching gas mixture leads to increased faceting of the masks.

In the case of platinum etching using a resist mask, the consequence of using reactive gases such as chlorine or hydrogen bromide was that intermediate redepositions form, which disappear again in the further course of the etching. The structures again lead to CD-propagation and to flat platinum edges. By now, they are considered to be the greatest disadvantage of the process that employs both chlorine and a resist mask.

If instead of the resist mask a so-called hard mask is used to structure the layers to be structured, then many of the above difficulties can be markedly reduced. However, structuring a hard mask requires additional process steps, which make the overall process more expensive.

SUMMARY OF THE INVENTION

It is accordingly an object of the invention to provide a structuring method which overcomes the above-mentioned disadvantages of the prior art methods of this general type.

With the foregoing and other objects in view there is provided, in accordance with the invention, a structuring method, which includes: providing at least one layer to be structured; applying a mask to the at least one layer; structuring the at least one layer using the mask; removing the mask while leaving behind redepositions of material of the at least one layer; and removing the redepositions of material of the at least one layer by one of mechanical polishing and chemical-mechanical polishing.

In accordance with an added feature of the invention, there is the step of applying a resist mask as the mask and removing the resist mask by incineration.

It has been found that by mechanical polishing, the redepositions of the material of the layer to be structured, which could be removed only with difficulty using conventional chemical methods, can be removed relatively simply and reliably, without damage to or destruction of the structures already created on the wafer. The method of the invention thus has the advantage that the methods employed for the actual structuring of the layer to be structured, such as plasma-chemical etching processes, can be selected without taking into account the question of whether these methods lead to increased redepositions. For instance, plasma-chemical etching processes with pure argon plasmas can be employed. As a consequence, even conventional resist masks can now be used, without causing excessive faceting on the masks as was the case when reactive gases were used.

With the foregoing and other objects in view there is also provided, in accordance with the invention, a structuring method, which includes: providing at least one layer to be structured; applying a mask to the at least one layer; structuring the at least one layer using the mask; removing the mask and redepositions of a material of the at least one layer by chemical-mechanical polishing.

By the simultaneous removal of the mask and the redepositions, one process step can be saved. This opportunity is especially attractive whenever a so-called hard mask is used as the mask. Such a mask preferably contains silicon, a silicon oxide, in particular $SiO_2$; a metal, in particular aluminum or tungsten; a metal nitride, preferably a titanium nitride, and in particular $TiN_x$ $0.8<x<1.2$; or a metal silicide.

Preferably, after the removal of the redepositions, a "scrubber" cleaning is performed. In addition or alternatively, after the removal of the redepositions, a wet chemical cleaning is performed, in particular enhanced by sound including a sonic action (ultrasonic, fine sonic).

In accordance with another feature of the invention, there is the step of forming the at least one layer from a material selected from the group consisting of copper, iron, cobalt, nickel, a 4d transition metal and a 5d transition metal, in particular a platinum metal.

It is also preferred if the layer to be structured contains a ferroelectric material, a dielectric material of high relative dielectric constant (>20), a perovskite, or precursors of the materials. A precursor of the aforementioned materials is understood to be a material that can be converted into the materials mentioned by a suitable heat treatment (such as tempering), optionally with oxygen being supplied.

It is preferred if the layer to be structured contains strontium bismuth tantalate (SBT, $SrBi_2Ta_2O_9$), strontium bismuth niobate tantalate (SBNT, $SrBi_2Ta_{2-x}Nb_xO_9$, where x=0 to 2), lead zirconate titanate (PZT, $Pb(Zr,Ti)O_3$), or derivatives thereof, as well as barium strontium titanate (BST, $Ba_xSr_{1-x}TiO_3$, where x=0 to 1), lead lanthanum titanate (PLT, $(Pb,La)TiO_3$), lead lanthanum zirconate titanate (PLZT, $(Pb,La)(Zr,Ti)O_3$), or derivatives thereof.

It is also preferred if the layer to be structured contains platinum, gold, silver, iridium, palladium, ruthenium, rhenium, or their oxides. Preferably, a dry etching process, in particular plasma etching, is employed for structuring the layer to be structured.

It is then preferred in particular if during the dry etching of the layer to be structured, a gas mixture that is free of reactive gases is provided. It is also preferred if during the dry etching of the layer to be structured, a noble gas, in particular argon, is provided.

In accordance with another added feature of the invention, there is the step of dry etching the at least one layer with a gas mixture including noble gases, nitrogen and oxygen during the structuring step.

In accordance with a concomitant feature of the invention, there is the step of forming the mask from a material selected from the group consisting of silicon, a silicon oxide including silicon dioxide, a metal including aluminum and tungsten, a metal nitride including a titanium nitride in particular $TiN_x$ $0.8<x<1.2$, and a metal silicide.

Other features which are considered as characteristic for the invention are set forth in the appended claims.

Although the invention is illustrated and described herein as embodied in a structuring method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 4:
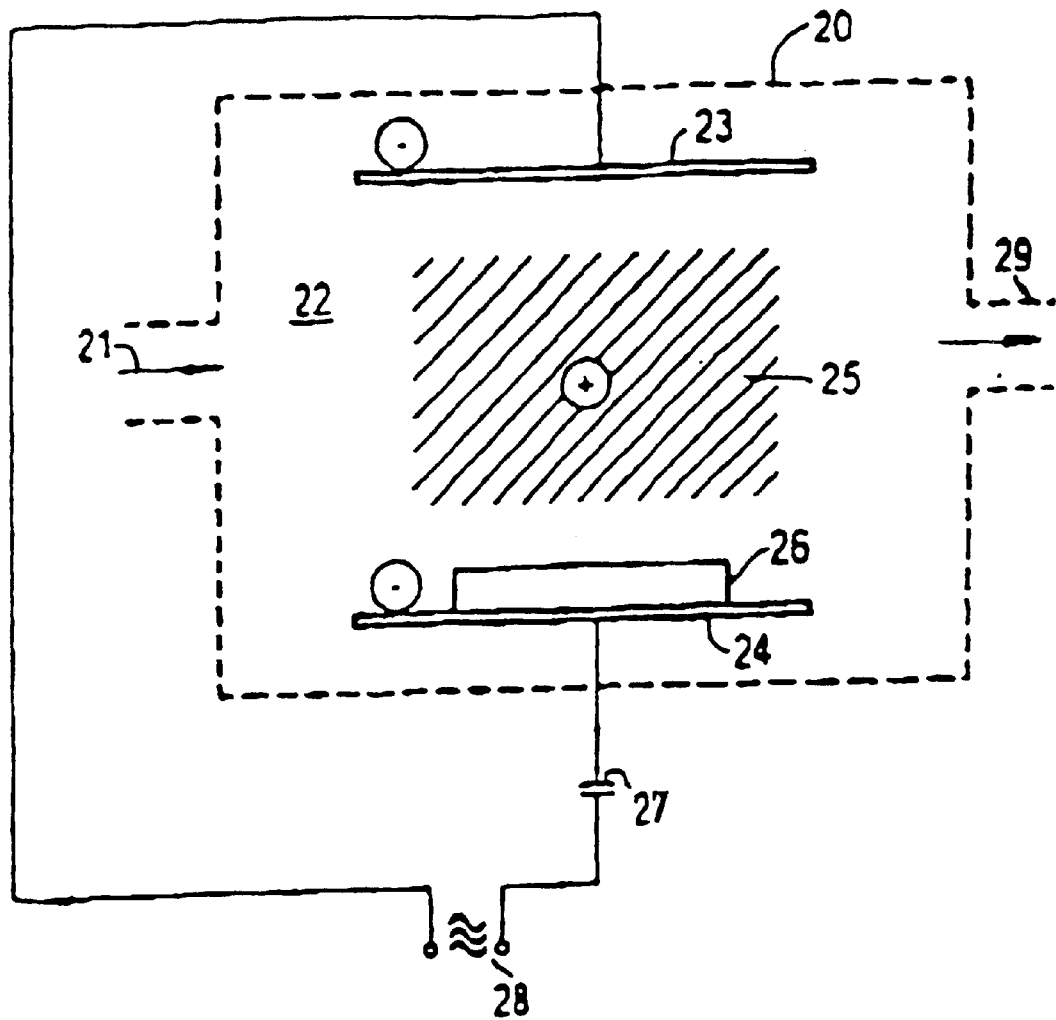
FIG. 4 is a diagrammatic illustration of an etching chamber in a form of a parallel plate reactor.

Referring now to the figures of the drawing in detail and first, particularly, to FIG. 4 thereof, there is shown the basic operating mode of an etching chamber, taking as an example a parallel-plate reactor 20. A gas mixture, such as Ar and $Cl_2$, is delivered to the reactor chamber 22 via a gas inlet 21 and is pumped out again through a gas outlet 29. A lower plate 24 of the parallel plate reactor 20 communicates via a capacitor 27 with a high-frequency source 28 and acts as a substrate holder. By applying a high-frequency electrical alternating field to an upper plate 23 and the lower plate 24 of the parallel plate reactor 20, the gas mixture is converted into a plasma 25. Since the mobility of the electrons is greater than that of the gas cations, the upper and lower plates 23, 24 become negatively charged capacitively compared with the plasma 25. The two plates 23, 24 therefore exert a strong attraction force on the positively charged gas cations, so that they are exposed to a permanent bombardment with these ions, such as $Ar^+$. Since the gas pressure is also kept low, typically 0.1 to 10 Pa, only a slight scattering of the ions among one another and with the neutral particles occurs. The ions meet the surface of a substrate 26, which is held on the lower plate 24 of the parallel plate reactor 20, virtually at a right angle. This allows good duplication of a mask (not shown) on the underlying layer, which is to be etched, of the substrate 26.

Figure 1:
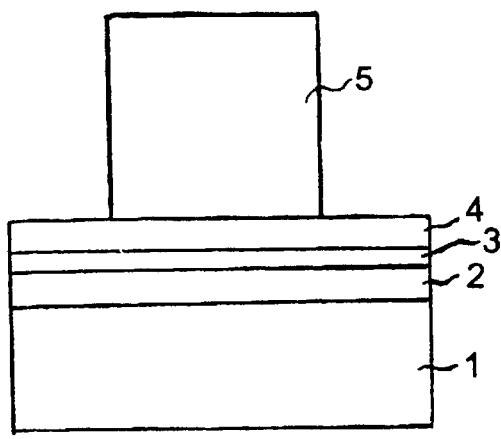
FIGS. 1–3 are front elevational views of a structuring method according to the invention.
Figure 2:
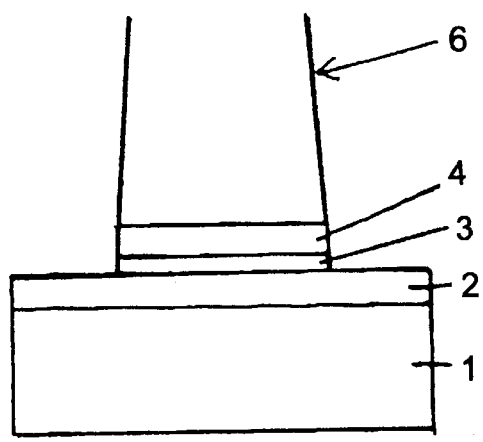
Figure 3:
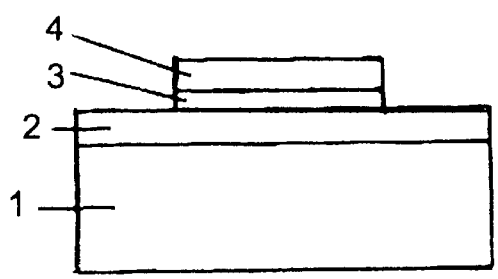

Referring now to FIGS. 1–3, there is shown a schematic illustration of the method of the invention. On a substrate 1, an $SiO_2$ layer 2 is applied. This is followed by an adhesion or barrier layer 3 of titanium or titanium nitride. On the adhesion or barrier layer 3, a platinum layer 4 is applied, for instance by sputtering, as the layer to be structured.

On the platinum layer 4, a resist layer 5 is formed, which will later be used as a mask 5 for structuring the platinum layer 4. The resist layer 5 is structured by a light exposure step and a development step. The resultant structure is shown in FIG. 1.

Next, ion etching or sputter etching is performed, in order to subject the platinum layer 4 to physical dry etching. A pure argon gas is used as the etching gas. Instead of ion etching, other plasma etching processes may also be employed, such as reactive ion etching (RIE), magnetically enhanced reductive ion etching (MERIE), electronic cyclotron resistance etching (ECR), or inductively coupled plasma etching processes (ICP, TCP).

Since pure argon can be used as the etching gas, excessive faceting of the mask 5 does not occur. Correspondingly, the erosion of the mask 5 is also slight. Because of the lesser mask erosion, there is greater dimensional stability of the structuring. Furthermore, steeper etching edges of the layer to be structured can also be attained. Etched edges with an edge angle of over 80° can be created.

Because of the missing chemical component, during the dry etching, redepositions 6 of platinum occur at the side walls of the resist mask 5. Until now, these platinum redepositions 6 could be removed only with difficulty by the usual chemical processes.

For removing the resist mask 5, a resist incineration follows. In the process, the free-standing platinum redepositions 6 remain behind on the surface of the structured platinum layer 4. The resultant structure is shown in FIG. 2.

Next, the redepositions 6 are removed by mechanical polishing. For this purpose, a Logitech polisher can be used. A polishing cloth (such as Chemcloth ELCON 136) is put in contact with the structure shown in FIG. 2. The structure shown in FIG. 2 and the polishing cloth are moved relative to one another at a speed of 10 revolutions per minute for three minutes. At the same time, $Al_2O_3$ particles approximately 0.25 μm in size are delivered in an aqueous suspension (pH≈9).

A "scrubber" cleaning follows. In addition or as an alternative, after removal of the redepositions 6, wet chemical cleaning can also be done, for instance with highly dilute HF acid, preferably enhanced by sonic action. This causes the chemical dissolution of the $SiO_2$ surface laid bare between the platinum structures, and to a mechanically enhanced removal of particles from these regions. The resultant structure is shown in FIG. 3.

We claim:

1. A structuring method, which comprises:
   providing at least one layer to be structured;
   applying a mask to the at least one layer;
   structuring the at least one layer using the mask;
   removing the mask while leaving behind redepositions of material of the at least one layer; and
   removing the redepositions of the material of the at least one layer by one of mechanical polishing and chemical-mechanical polishing.

2. The method according to claim 1, which comprises applying a resist mask as the mask and removing the resist mask by incineration.

3. The method according to claim 1, which comprises performing a "scrubber" cleaning of the at least one layer after completing the removal of the redepositions step.

4. The method according to claim 1, which comprises performing a wet chemical cleaning of the at least one layer after completing the removal of the redepositions step.

5. The method according to claim 3, which comprises reinforcing the "scrubber" cleaning step with sound action.

6. The method according to claim 4, which comprises reinforcing the wet chemical cleaning step with sound action.

7. The method according to claim 1, which comprises forming the at least one layer from a material selected from the group consisting of copper, iron, cobalt, nickel, a 4d transition metal, and a 5d transition metal.

8. The method according to claim 1, which comprises forming the at least one layer from a platinum metal.

9. The method according to claim 1, which comprises forming the at least one layer from a material selected from the group consisting of a ferroelectric material, a dielectric material of high permittivity, and a perovskite.

10. The method according to claim 9, which comprises forming the at least one layer from a material selected from the group consisting of strontium bismuth tantalate ($SrBi_2Ta_2O_9$), strontium bismuth niobate tantalate ($SrBi_2Ta_{2-x}Nb_xO_9$, where x=0 to 2), lead zirconate titanate ($Pb(Zr,Ti)O_3$), barium strontium titanate ($Ba_xSr_{1-x}TiO_3$, where x =0 to 1), lead lanthanum titanate ($(Pb,La)TiO_3$), and lead lanthanum zirconate titanate ($(Pb,La)(Zr,Ti)O_3$).

11. The method according to claim 1, which comprises forming the at least one layer from a material selected from the group consisting of platinum, gold, silver, iridium, palladium, ruthenium, rhenium, and their oxides.

12. The method according to claim 1, which comprises dry etching the at least one layer with a gas mixture that is free of reactive gases during the structuring step.

13. The method according to claim 1, which comprises dry etching the at least one layer with a gas mixture including only noble gases, nitrogen and oxygen during the structuring step.

14. The method according to claim 1, which comprises dry etching the at least one layer with a gas mixture including a noble gas.

15. The method according to claim 1, which comprises dry etching the at least one layer with a gas mixture including argon.

16. The method according to claim 1, which comprises forming the mask from a material selected from the group consisting of a silicon, a silicon oxide including silicon dioxide, a metal including aluminum and tungsten, a metal nitride including a titanium nitride, and a metal silicide.

17. The method according to claim 1, which comprises forming the mask from $TiN_x 0.8<x<1.2$.

18. A structuring method, which comprises:
providing at least one layer to be structured;
applying a mask to the at least one layer;
structuring the at least one layer using the mask;
removing the mask and redepositions of a material of the at least one layer by chemical-mechanical polishing.

19. The method according to claim 18, which comprises performing a "scrubber" cleaning of the at least one layer after completing the removal of the redepositions step.

20. The method according to claim 18, which comprises performing a wet chemical cleaning of the at least one layer after completing the removal of the redepositions step.

21. The method according to claim 19, which comprises reinforcing the "scrubber" cleaning step with sound action.

22. The method according to claim 20, which comprises reinforcing the wet chemical cleaning step with sound action.

23. The method according to claim 18, which comprises forming the at least one layer from a material selected from the group consisting of copper, iron, cobalt, nickel, a 4d transition metal, and a 5d transition metal.

24. The method according to claim 18, which comprises forming the at least one layer from a platinum metal.

25. The method according to claim 18, which comprises forming the at least one layer from a material selected from the group consisting of a ferroelectric material, a dielectric material of high permittivity, and a perovskite.

26. The method according to claim 25, which comprises forming the at least one layer from a material selected from the group consisting of strontium bismuth tantalate ($SrBi_2Ta_2O_9$), strontium bismuth niobate tantalate ($SrBi_2Ta_{2-x}Nb_xO_9$, where x=0 to 2), lead zirconate titanate ($Pb(Zr,Ti)O_3$), barium strontium titanate ($Ba_xSr_{1-x}TiO_3$, where x=0 to 1), lead lanthanum titanate (($Pb,La)TiO_3$), and lead lanthanum zirconate titanate (($Pb,La)(Zr,Ti)O_3$).

27. The method according to claim 18, which comprises forming the at least one layer from a material selected from the group consisting of platinum, gold, silver, iridium, palladium, ruthenium, rhenium, and their oxides.

28. The method according to claim 18, which comprises dry etching the at least one layer with a gas mixture that is free of reactive gases during the structuring step.

29. The method according to claim 18, which comprises dry etching the at least one layer with a gas mixture including only noble gases, nitrogen and oxygen during the structuring step.

30. The method according to claim 18, which comprises dry etching the at least one layer with a gas mixture including a noble gas.

31. The method according to claim 18, which comprises dry etching the at least one layer with a gas mixture including argon.

32. The method according to claim 18, which comprises forming the mask from a material selected from the group consisting of a silicon, a silicon oxide including silicon dioxide, a metal including aluminum and tungsten, a metal nitride including a titanium nitride, and a metal silicide.

33. The method according to claim 18, which comprises forming the mask from $TiN_x 0.8<x<1.2$.

* * * * *